United States Patent [19]

Herron et al.

[11] 4,295,180
[45] Oct. 13, 1981

[54] WALL MOUNTABLE HOUSING FOR PROGRAMMABLE THERMOSTAT

[76] Inventors: Clifford W. Herron, 717 Via Bravo, Mesquite, Tex. 75150; Robert J. Wunderlich, 961 Easton Pl., Dallas, Tex. 75218

[21] Appl. No.: 156,401

[22] Filed: Jun. 4, 1980

[51] Int. Cl.³ ............................................. H05K 7/20
[52] U.S. Cl. .................................. 361/383; 340/719; 313/312; 361/399
[58] Field of Search ...................... 340/718, 719, 757; 174/52 R; 313/312, 519; 361/331, 380–383, 395, 399

[56] References Cited

U.S. PATENT DOCUMENTS

| | | | |
|---|---|---|---|
| 4,092,698 | 5/1978 | Brefka | 361/399 |
| 4,203,148 | 5/1980 | McComas | 361/399 |
| 4,245,274 | 1/1981 | MacDonald | 361/399 |

Primary Examiner—Gerald P. Tolin
Attorney, Agent, or Firm—Thomas L. Cantrell; Joseph H. Schley; Stanley R. Moore

[57] ABSTRACT

Disclosed is a packaging system for housing a programmable thermostat. The thermostat is easily installed with a minimum of tools. The housing securely contains the electronic components and conveniently and attractively mounts upon the wall without exposed attachment means. A hinged door covers the control elements but controls remain accessable for deliberately setting the thermostat. The hinge has no loose parts and is established from elements carried on the door, the face plate and rear panel of the box like housing which encases the electronic components. The electronic components are held to the housing and the housing members attach to enclose the electronic components by press-engaging detent daggers. Finally, the packaging system allows for easy disassembly for access to the electronic components should repair be required.

4 Claims, 7 Drawing Figures

WALL MOUNTABLE HOUSING FOR PROGRAMMABLE THERMOSTAT

BACKGROUND

Programmable thermostats allow for automatically changing the thermostat setting according to a variable and prearranged timetable. This allows increased energy efficiency in central heating and air conditioning at a minimal loss of comfort.

The present invention relates to the packaging or encasement of a programmable thermostat. A substantial marketing advantage is afforded programmable thermostat units that have the ability to replace existing thermostats and to thereby interface with a variety of currently installed systems. Further, it is preferred that the installation and assembly be simple enough that many homeowners can install the unit without employing a technician. The housing should be easily affixed to the wall and securely contain the electronic components. Also, the controls should be accessible, yet protected from idle tampering. Finally, the housing must be capable of economical manufacturing.

Each of these attributes is well served by the present invention.

SUMMARY OF THE INVENTION

The programmable thermostat of the present invention is assembled from six major pieces. The electronic components are on a circuit card and superposing keyboard and the housing is formed from a rear panel, face plate, door and window. The electronic components are best assembled at the factory, including the attachment of the keyboard which is mounted on spacers to separate it from underlying components. It is convenient to connect the keyboard to the card by screw means passing through the card and received into the spacers.

Installation of the programmable calculator begins with mounting the rear panel of the housing onto the wall. One set of apertures is provided in the back panel whereby screws pass through to anchor into the wall behind. Other apertures are provided in the back panel to allow the passage of wires from the heating or air conditioning system into the housing where they connect to the electronic components. The rear panel also carries snap receiving means and an integral portion of the hinge upon which the door will swing.

The face plate carries snap and alignment means whereby the circuit card and attached keyboard are connected to it. The face plate has apertures that allow access to manual switches, the keyboard, and display elements. The inside of the face plate also carries snaps which engage the rear panel upon assembly to enclose the electronic components, mounting them on the wall between the face plate and rear panel.

A hinged door is included in the housing to cover the keyboard and switches and it is arranged to be held in position by hinge elements carried by the front plate and rear panel. The door carries the rings of the hinges by which it is connected to the remainder of the housing. The pins are carried by either the face plate or back panel and collars are provided by both of these. The hinge is assembled when the face plate and rear panel are snapped together and collars seat on the ends of the pins to limit the axial freedom of the rings.

The arrangement of the present invention, discussed in greater detail below, provides an easy to install and assemble housing that has no exposed mounting means yet is easily disassembled for service.

DETAILED DESCRIPTION

Figure 1:
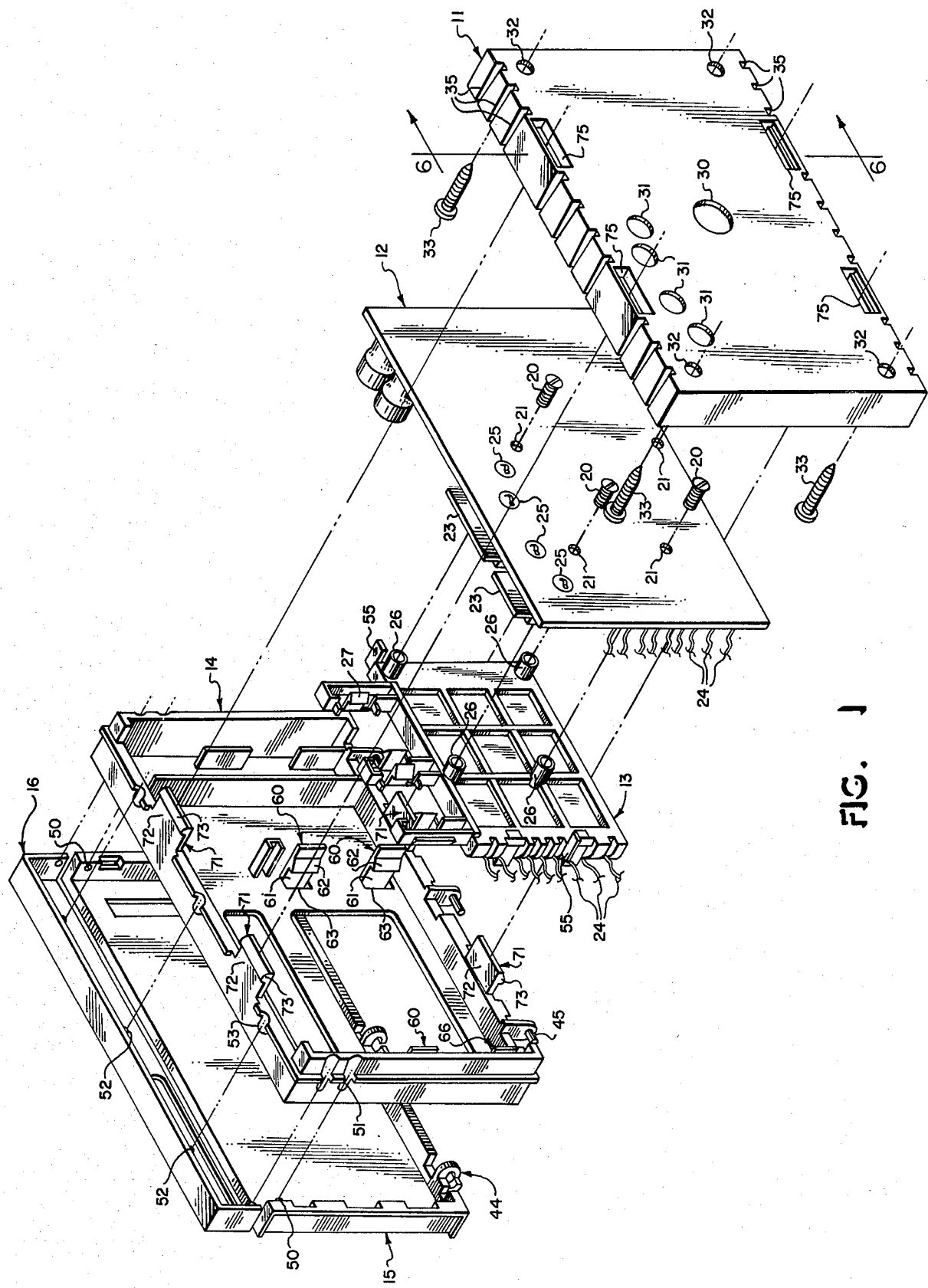
FIG. 1 is an exploded perspective view of the packaging system of the present invention.

The packaging, assembly, and installation of the programmable thermostat in the present invention is based upon the interaction of six members, the electronic circuit card 12, keyboard 13, rear panel 11, face plate 14, door 15 and window 16. See FIG. 1.

The bulk of electronic components are built onto solid state card 12. Keyboard 13 is attached over some of these components by screws 20 which pass through holes 21 in card 12 to be threadedly received into spacers 26. Further, snaps, have detent daggers 27, seat and attach about digital display elements 23. The snaps aid in aligning spacers 26 with holes 21. Wires 24 connect the keyboard to the circuit board.

The circuit board and attached keyboard are snapped into face plate 14 which itself attaches to rear panel 11 during assembly to enclose the electronic components. In addition, the same operation which established the enclosure about the electronic components also secures door 15 about hinges 40 by securing rings 44 upon pins 45.

Figure 3:
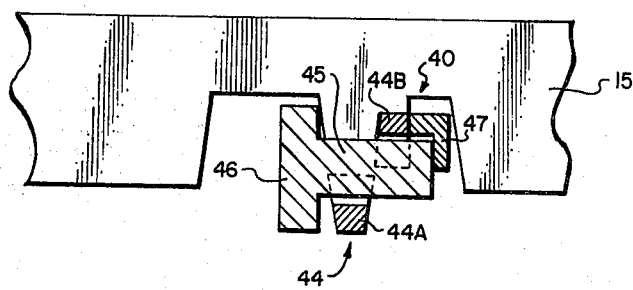
FIG. 3 is a cross sectional view of one hinge assembly taken along line 3—3 in FIG. 2.
Figure 2:
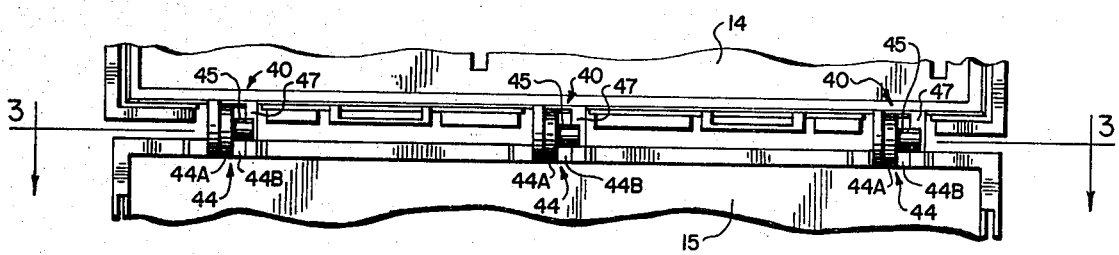
FIG. 2 is an elevational frontal view of the hinge connecting the door to the remainder of the housing of the present invention.
Figure 4:
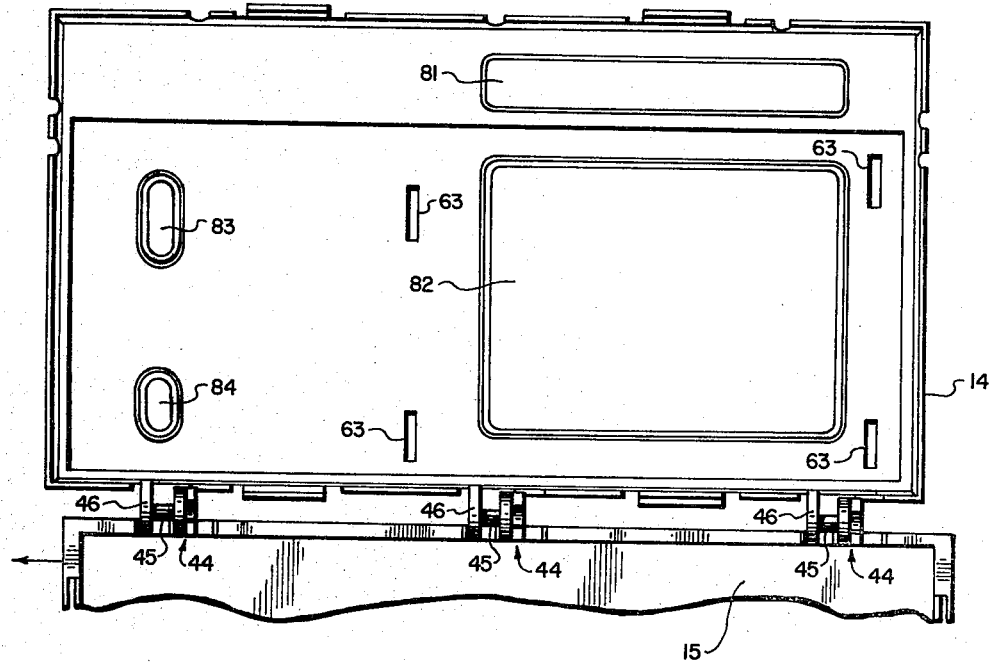
FIG. 4 is an elevational frontal view of an assembly step in constructing a packaging system in accordance with the present invention.

FIGS. 2, 3 and 4 show the assembly of hinge 40. FIG. 2 illustrates an assembled hinge with door 15 fully open. FIG. 3 best illustrates an assembled hinge by focusing on the cross section of one set of engaged hinge elements. This cross section is taken along line 3—3 of FIG. 2.

Rings 44 are formed of two parts, hooks 44A and 44B, each formed integrally with door 15. Splitting ring 44 into two opposing and axially displaced semicircular hooks, 44A and 44B, promotes easy plastic injection molding of a completely formed door with attached hinge elements. Assembled into a hinge, hook sections 44A and 44B encircle pin 45 in a pivotal engagement. Pins 45 protrude from pin blocks 46 which are here formed with face plate 14. Collar 47 is here carried on rear panel 11. The collar seats on the extended end of pin 45 to cooperate with pin block 46 in limiting the axial freedom of ring 44 on pin 45. This arrangement provides for attaching the hinged door without any tools and with no loose parts. Assembly operations are described further below.

Installation of a programmable thermostat packaged in the housing of this invention begins with mounting unassembled rear panel 11 onto the wall of the room. Wires leading to the central air conditioning and heating systems are brought into the housing through apertures in the back wall of the rear panel. If the four control wires (not shown) are bound where they exit the wall of the room, they are most easily brought through aperture 30; however, if separate, apertures 31 which align with terminals 25 are more convenient. Rear panel 11 is fastened to the wall with screws 33 passing through apertures 32 after the control wires have been brought through.

Figure 5:
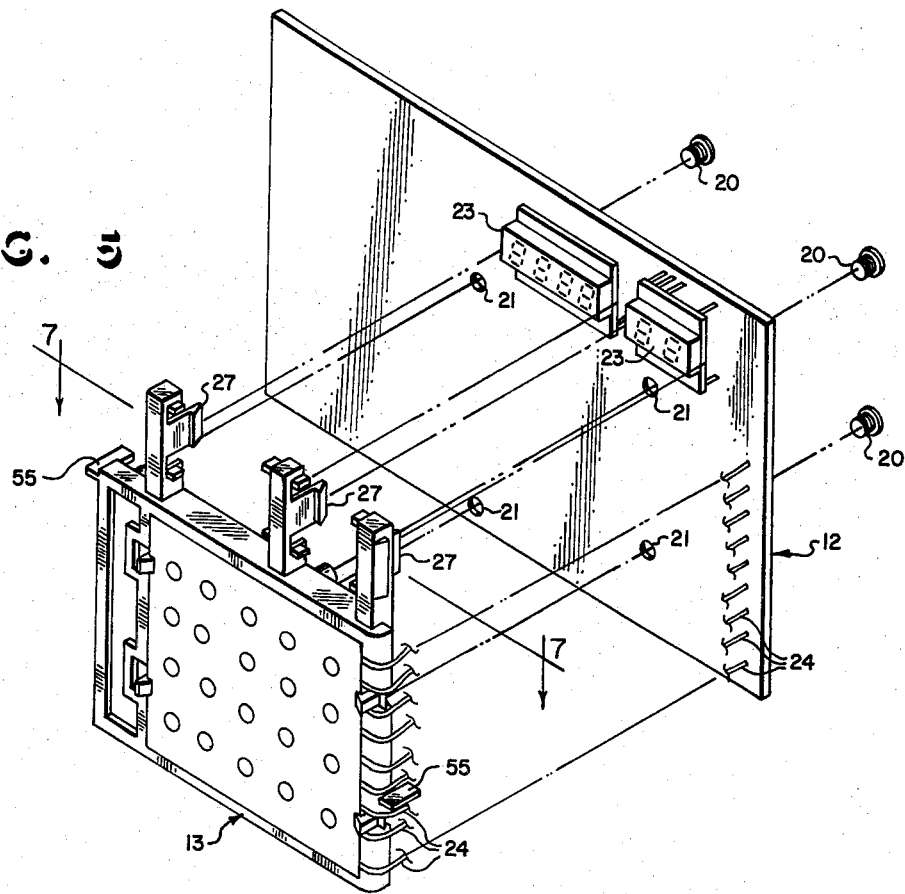
FIG. 5 is an exploded perspective view illustrating the interconnection of a keyboard and circuit card, connected in accordance with the present invention.
Figure 6:
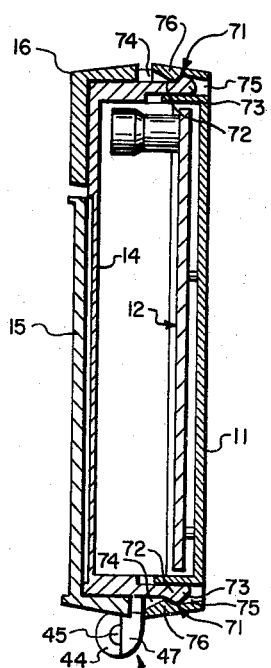
FIG. 6 is a laterally viewed cross section of an assembled packaging system embodying the present invention.
Figure 7:
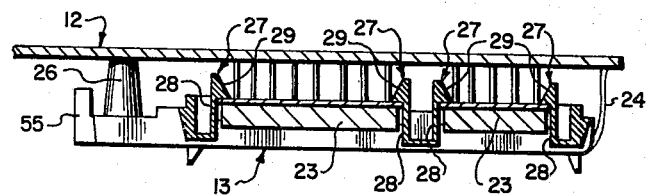
FIG. 7 is a top view of a cross section taken along line 7—7 of FIG. 5 illustrating an attached keyboard and circuit card connected in accordance with the present invention.

It is preferred that keyboard 13 be fastened to circuit card 12 at the factory presenting the person installing the unit with a completed electronic package which clips to the face plate. FIG. 7 shows a cross section of the assembled electronic package of FIG. 5. Detent daggers 27 engage display elements 23 to align the keyboard with the circuit card. Each detent dagger has a resilient arm 28 and engaging catch 29. The resilient arms allow the catches to clear the edges of the display elements during insertion and to spring into engagement upon full insertion. See FIG. 7. FIG. 5 shows screws 20 that pass through apertures 21 in circuit card 12 to threadingly engage spacers 26 and thereby secure the keyboard to the circuit card.

While it is preferred that the electronic package be assembled when sold, the ease herein provided is advantageous in the packaging sense in that it promotes inexpensive manufacture and easy disassembly should repair ever become necessary.

The assembled electronics package snaps into face plate 14. See FIG. 1. Guide 55 of keyboard 13 engages grooves 56 to align the keyboard with detent daggers 60. Pressing the electronic package further into face plate 14 forces resilient arms 61 of detent daggers 60 to yield until, when fully inserted, catches 62, which are biased by resilient arms 61, close behind the edge of the inserted keyboard. This secures the electronic package to the face plate. At this point, control wires presented through rear panel 11 are attached to terminals 25 of circuit card 12.

The apertures through face plate 14 provide access to elements of the electronic components. See FIG. 4. Apertures 84 and 85 allow switches to pass through the faceplate. Aperture 82 provides access to keyboard 13. Aperture 81 allows a view of display elements 23. In the assembled unit, hinged door 15 protects the switches and keyboard but does not cover the display elements.

The next step in installing and assembling the housing about the electronic components is to hang door 15 in preparation to assemble hinge 40. FIG. 4 illustrates the assembly stage of threading rings 44 carried on door 15 over pins 45 carried on face plate 14. Door 15 is closed against the face plate by pivoting it about these hinge elements after rings 44 are slid over pins 45 to meet pin blocks 46 which act as collars limiting the axial freedom of the rings in that direction. Rounded, non-locking detent snaps 50 of door 15 are received into recesses 51 of face plate 14 to hold the door closed. Closing the door holds rings 44 in place upon pins 45 until collars 47 seat upon the open ends of the pins to secure the rings upon the pins throughout all positions of door 15.

In this embodiment collars 47 are carried by rear panel 11 which is mounted to the wall of the building by screws 33. These collars are seated at the free ends of pins 45 at the same time the face plate 14 and the attached door 15 are connected to the rear panel. Face plate 14 carries detent daggers 71 which are received into slots 75. Detent daggers 71 have resilient arms 72 which allow catch 73 to pass retainers 76 in slots 75. The resilient arms bias the catches against the retainers to secure face plate 14 to rear panel 11. Thus pressing the face plate into engagement with the rear panel snaps the two together and encases the electronic components completing the hinge assembly. Air circulation to the sensing elements is provided by vents 35 in the rear panel.

Installation of window 16 completes packaging the electronic components and installation of that package upon the wall. The window carries detent snaps 52 to engage recesses 53 on face plate 14. The window is placed above that part of face plate 14 protected by door 15 and covers aperture 60 of the face plate through which display elements 23 are visible.

Finally, despite the internal connection means, disassembly is convenient should service ever be necessary. Slots 74 allows access to depress resilient arms 72 and left retainer 76 in order to disengage catch 73. This allows separation of face plate 14 from rear panel 11, but all the electronic components remain attached to the face plate. Slots 63 in face plate 14 allow access to resilient arms 28. Depressing arms 28 disengage catches 29 and allows removal of the electronic components from the face plate and presents the components for service. If necessary, keyboard 13 can be removed for additional access to circuit card 12.

Packaging the electronic components of a programmable thermostat in accordance with the present invention produces a unit that is capable of installation into a wide range of existing heating and air conditioning systems by homeowners of no particular technical expertise. A minimal number of parts, only six in the preferred embodiment, interconnect to support, house, and protect the electronic elements of the programmable thermostat. These parts are subject to easy and inexpensive manufacture in plastics by existing injection molding methods.

The parts interconnect to produce a unit that is easily installed with only a screwdriver and minimal use of that tool to prevent attendant risks of damage to electronic components. Further, the connecting means, except the hinges, are located inside the housing rather than as exterior attachment means, thus allowing simpler lines conducive to an aesthetically pleasing appearance. Despite the use of internal connectors, disassembly remains a simple procedure.

The door is hung on an exterior hinge assembled from members that are integrally formed on three different parts of the housing, the door, the faceplate, and the rear panel. No tools and no loose parts are required to assemble the hinge.

We claim:

1. A wall mountable housing having multiple members which, together, enclose the electronic components of a programmable thermostat having switching controls, keyboard, and display elements, said housing comprising:
   a generally rectangular rear panel comprising: means for attaching said rear panel to said wall;
   at least one aperture whereby control wires pass through the rear panel and into said housing;
   a first hinge element at an edge of said panel; and
   first detent dagger means whereby the rear panel is attachable to another housing member;

second detent dagger means whereby the electronic components are connectable to a housing member;

a generally rectangular face plate comprising:
third detent dagger means whereby the face plate is connectable to a housing member;
an aperture whereby the switching controls and display elements are accessible;
an aperture whereby the display elements are viewable; and
a second hinge element at an edge of said face plate;

a door whereby switching controls and keyboard of the programmable thermostat are protected, said door comprising:
latching means; and
a third hinge element at an edge of said door whereby, interacting with said first and second hinge elements, the door is pivotally connected to the attached face plate and rear panel;

a window whereby the display elements are protected and viewable; and vents whereby air circulates through said housing.

2. A housing in accordance with claim 1 in which:
said first hinge element is a collar formed integrally with said rear panel at an edge thereof;
said second hinge element is a pin block formed integrally with said face plate at an edge corresponding to the placement of said collar in relation to said rear panel, said pin block having a collar face and an extended pin projecting therefrom parallel to the face plate edge whereon the pin block is formed; and
said third hinge element is a ring formed integrally with said door at an edge thereof, said ring being pivotally receivable upon said pin;
whereby upon assembly of said rear panel, face plate, and door to one another, a hinge is formed by the interconnection of said first, second and third hinge elements, thus pivotally connecting said door to the face plate and rear panel through said hinge in which said ring pivotally engages said pin and is axially fixed in said engagement between said collar face of said pin block and said collar.

3. A housing in accordance with claim 1 in which:
said first hinge element is a pin block formed integrally with said rear panel at an edge thereof, said pin block having a collar face and an extended pin projecting therefrom parallel to the rear panel edge whereon the pin block is formed;
said second hinge element is a collar formed integrally with said face plate at an edge thereof corresponding to the placement of said pin block relative to said rear panel;
said third hinge element is a ring formed integrally with said door at an edge thereof said ring pivotally receivable upon said pin;
whereby upon assembly of said rear panel, face plate, and door to one another, a hinge is formed by the interconnection of said first, second and third hinge elements, thus pivotally connecting said door to the face plate and the rear panel through said hinge in which said ring pivotally engages said pin and is axially fixed in said engagement between said collar face of said pin block and said collar.

4. A packaging assembly for a wall mountable programmable thermostat, said packaging assembly interconnecting members supporting electronic components and multiple housing members, said packaging assembly forming a housing and comprising:

a rear panel of an open box-like configuration having side walls and a back wall, said rear panel further comprising:
a first aperture in the back wall of said rear panel whereby screw means, internal to an interconnected assembly, is employable to fasten said rear panel to said wall;
a second aperture in the back wall whereby control wires pass through the rear panel and into said housing;
a plurality of collars on an edge of said rear panel;
a detent dagger receiving means and detent dagger whereby, upon interconnection of the packaging assembly, the detent dagger receiving means receives the detent dagger in an engagement interior to the housing; and
vents in said side walls whereby air circulates through said housing;

electronic component support members comprising:
a circuit board having display elements attached thereto;
a keyboard attachable to said circuit board, said keyboard having detent dagger means whereby the keyboard is attachable to said circuit board and having spacers whereby said keyboard is held a fixed distance from said circuit board;

a face plate comprising:
a first detent dagger having a resilient arm and a catch whereby said electronic component support members are secured to said face plate;
a second detent dagger having a resilient arm and a catch whereby said face plate engages said detent dagger receiving means to secure said face plate to said rear panel;
a first aperture whereby said switching controls are accessible; a second aperture whereby said keyboard is accessible;
a third aperture whereby said display elements are viewable;
a forth aperture whereby said resilient arm of said first detent dagger is accessible to release said catch of said first detent dagger to thereby release the electronic component support members from the face plate;
a plurality of pin blocks disposed at an edge of said face plate, each having a collar face and a pin projecting therefrom parallel to the edge of said face plate whereby, upon interconnection of the packaging assembly, the extended ends of said pins seat against said collars;

a door whereby the switching controls and keyboard of the programmable thermostat are protectable, said door comprising:
latching means;
a plurality of rings each of which is formed from a plurality of opposing and axially displaced semicircular hooks, whereby upon assembly, the door is pivotally attached to each said pin by one of said rings rotably engaged around said pin and axially held in place by said collar and said collar face of said pin block disposed on either side of said ring; and a window over said third aperture in said face plate whereby said display elements are protected and viewable;

whereby, upon interconnection of the packaging assembly members an assembled housing is formed having no external connecting means, said housing further having an aperture whereby said resilient arm of said second detent dagger is accessible to release said catch from said detent dagger receiving means, thereby releasing the face plate from the rear panel.

* * * * *